(12) United States Patent
Tseng et al.

(10) Patent No.: US 10,277,121 B2
(45) Date of Patent: Apr. 30, 2019

(54) CHARGE PUMP CIRCUIT AND OPERATING METHOD THEREOF

(71) Applicant: Raydium Semiconductor Corporation, Hsinchu (TW)

(72) Inventors: Pei-Kai Tseng, Keelung (TW); Li-Chieh Chen, Taipei (TW); Chih-Jen Hung, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/052,204

(22) Filed: Aug. 1, 2018

(65) Prior Publication Data

US 2019/0044437 A1 Feb. 7, 2019

Related U.S. Application Data

(60) Provisional application No. 62/540,129, filed on Aug. 2, 2017.

(51) Int. Cl.
*H02M 1/00* (2006.01)
*H02M 3/07* (2006.01)
*G01R 19/165* (2006.01)

(52) U.S. Cl.
CPC ........ *H02M 3/07* (2013.01); *G01R 19/16552* (2013.01); *H02M 2001/0041* (2013.01); *H02M 2001/0045* (2013.01); *H02M 2003/071* (2013.01)

(58) Field of Classification Search
CPC ...................................................... H02M 3/07
See application file for complete search history.

(56) References Cited

U.S. PATENT DOCUMENTS

| | | | | |
|---|---|---|---|---|
| 2013/0201742 A1* | 8/2013 | Nabeto | ................... | H02M 3/07 |
| | | | | 363/140 |
| 2017/0077817 A1* | 3/2017 | Houston | .............. | H02M 3/1582 |
| 2017/0110965 A1* | 4/2017 | Osanai | ................ | H02M 3/1584 |
| 2017/0207703 A1* | 7/2017 | Houston | .............. | H02M 3/1582 |
| 2018/0138812 A1* | 5/2018 | Rose | ...................... | H02M 3/156 |
| 2018/0316266 A1* | 11/2018 | Cao | ........................ | H02M 3/158 |

\* cited by examiner

*Primary Examiner* — Jue Zhang
*Assistant Examiner* — Trinh Q Dang

(57) ABSTRACT

A charge pump circuit includes a first switch~a fourth switch, a capacitor, a current source, a first resistor, a second resistor, an amplifier, another current source, a current mirror, a skip detection circuit, a switch generation circuit and a control unit. A method includes: (a) starting the charge pump circuit; (b) operating the charge pump circuit in a first phase, wherein the first switch and second switch are conducted and the third switch and fourth switch are disconnected; (c) operating the charge pump circuit in a second phase, wherein the third switch and fourth switch are conducted and the first switch and second switch are disconnected; (d) determining whether a detected voltage in the skip detection circuit is higher than a threshold voltage; and (e) selectively performing step (b) or (c) again according to determination result of step (d).

14 Claims, 11 Drawing Sheets

CHARGE PUMP CIRCUIT AND OPERATING METHOD THEREOF

CROSS-REFERENCE TO RELATED APPLICATIONS

This Application claims the benefit of U.S. Provisional Application 62/540,129 filed on Aug. 2, 2017.

BACKGROUND

Field

The disclosure relates to a display panel; in particular, to a high-efficiency dynamic frequency adjusting charge pump circuit and operating method thereof applied to the OLED display panel.

Description of the Related Art

In the conventional OLED display panel (e.g., AMOLED display panel), the charge pump is usually disposed in the source driver. The charge pump is a DC-DC converter using the capacitor to store power and used for generating the output voltage higher than the input voltage or generating negative output voltage.

As shown in FIG. 1, the conventional charge pump circuit 1 can include capacitors CF, CL and switches SW1~SW4 and generate a negative voltage VNEG by transferring charges in the ping-pong way. In detail, the switches SW1 and SW4 are coupled in series between the input voltage VIN and the ground voltage GND; the switches SW2 and SW3 are coupled in series between the ground voltage GND and the negative voltage VNEG; one terminal of the capacitor CF is coupled between the switches SW1 and SW4 and another terminal of the capacitor CF is coupled between the switches SW2 and SW3; the capacitor CL is coupled between the negative voltage VNEG and the ground voltage GND.

As shown in FIG. 2, when the conventional charge pump circuit 1 is operated in the charging phase, namely during the first period T1 that the first phase signal PH1 in FIG. 4 is at high-level, the switches SW1 and SW2 are conducted and the switches SW3 and SW4 are disconnected, so that the capacitor CF can be charged by the input voltage VIN and the negative voltage VNEG is linearly increased; as shown in FIG. 3, when the conventional charge pump circuit 1 is operated in the transfer phase, namely during the second period T2 that the second phase signal PH2 in FIG. 4 is at high-level, the switches SW1 and SW2 are disconnected and the switches SW3 and SW4 are conducted, so that the charges stored in the capacitor CF flow out to form a transfer current and the negative voltage VNEG is linearly decreased. The phase of the first phase signal PH1 is the same with the phase of the clock signal CLK and the phase of the second phase signal PH2 is inverted to the phase of the clock signal CLK.

When the capacitor CF is larger, the capacitor CF stores more charges and larger transfer current is formed, and the ripple of the negative voltage VNEG also becomes larger. Since the amplitude of the ripple of the negative voltage VNEG can be expressed as $0.5*TSW*VIN*[CF/(CF+CL)]$, wherein TSW is the switching cycle; therefore, in the application of low ripple, the switching cycle TSW must be shortened, namely the switching frequency of the conventional charge pump circuit 1 must be increased.

However, when the switching frequency of the conventional charge pump circuit 1 becomes faster, the conventional charge pump circuit 1 will provide larger output current, as a result, the transfer efficiency of the conventional charge pump circuit 1 at light load will become poor. This shortcoming needs to be improved.

SUMMARY

Therefore, the disclosure provides a charge pump circuit applied to an OLED display panel and an operating method thereof to overcome the above-mentioned problems in the prior art.

An embodiment of the disclosure is a charge pump circuit. In this embodiment, the charge pump circuit includes a first switch, a second switch, a third switch, a fourth switch, a capacitor, a current source, a first resistor, a second resistor, a transduction amplifier, another current source, a current mirror, a skip detection circuit, a switch generation circuit and a control unit. The first switch and the fourth switch are coupled in series and the second switch and the third switch are coupled in series. The first switch is coupled to an input voltage and the second switch is coupled to a ground voltage. One terminal of the capacitor is coupled between the first switch and the fourth switch and another terminal of the capacitor is coupled between the second switch and the third switch. The current source is coupled between the fourth switch and the ground voltage. The first resistor and the second resistor are coupled between the third switch and a reference voltage. The transduction amplifier has a first input terminal, a second input terminal and an output terminal, wherein the first input terminal is coupled between the first resistor and the second resistor and the second input terminal is coupled to the ground voltage, the another current source is coupled to the output terminal of the transduction amplifier. The current mirror is coupled to the current source and the another current source respectively and used for generating a mirror current related to the current source and the another current source. The skip detection circuit is coupled to the current mirror and used for receiving the mirror current and generating a skip detection signal. The switch generation circuit is coupled to the skip detection circuit and used for receiving the skip detection signal and generating a clock cycle signal and a phase selection signal. The control unit is coupled to the switch generation circuit, the first switch, the second switch, the third switch and the four switch respectively and used for controlling the operation of the first switch, the second switch, the third switch and the four switch according to the clock cycle signal and the phase selection signal.

In an embodiment, a detection voltage of the skip detection circuit is related to the current source and the another current source; the skip detection circuit generates the skip detection signal according to a comparing result of the detection voltage and a threshold voltage.

In an embodiment, when the charge pump circuit is operated in a first phase, the control unit conducts the first switch and the second switch and disconnects the third switch and the fourth switch.

In an embodiment, the first phase is a charging phase and the second phase is a transfer phase.

In an embodiment, the switch generation circuit comprises a counting unit and an adjusting unit; the counting unit generates a specific counted value to the adjusting unit according to the skip detection signal, and the adjusting unit receives the specific counted value and a clock cycle signal and outputs the clock cycle signal and the phase selection signal.

Another embodiment of the disclosure is a charge pump circuit operating method. In this embodiment, the charge pump circuit operating method is used for operating a charge pump circuit. The charge pump circuit includes a first switch, a second switch, a third switch, a fourth switch, a capacitor, a current source, a first resistor, a second resistor, a transduction amplifier, another current source, a current mirror, a skip detection circuit, a switch generation circuit and a control unit. The first switch and the fourth switch are coupled in series and the second switch and the third switch are coupled in series. The first switch is coupled to an input voltage and the second switch is coupled to a ground voltage. One terminal of the capacitor is coupled between the first switch and the fourth switch and another terminal of the capacitor is coupled between the second switch and the third switch. The current source is coupled between the fourth switch and the ground voltage. The first resistor and the second resistor are coupled between the third switch and a reference voltage. The transduction amplifier has a first input terminal, a second input terminal and an output terminal, wherein the first input terminal is coupled between the first resistor and the second resistor and the second input terminal is coupled to the ground voltage, the another current source is coupled to the output terminal of the transduction amplifier. The current mirror is coupled to the current source and the another current source respectively. The skip detection circuit is coupled to the current mirror. The switch generation circuit is coupled to the skip detection circuit. The control unit is coupled to the switch generation circuit, the first switch, the second switch, the third switch and the four switch respectively.

The charge pump circuit operating method includes steps of: (a) starting the charge pump circuit; (b) operating the charge pump circuit in a first phase, wherein the first switch and second switch are conducted and the third switch and fourth switch are disconnected; (c) operating the charge pump circuit in a second phase, wherein the third switch and fourth switch are conducted and the first switch and second switch are disconnected; (d) determining whether a detected voltage in the skip detection circuit is higher than a threshold voltage; and (e) selectively performing the step (b) or the step (c) again according to a determination result of the step (d).

Another embodiment of the disclosure is a charge pump circuit operating method. In this embodiment, the charge pump circuit operating method is used for operating a charge pump circuit. The charge pump circuit includes a first switch, a second switch, a third switch, a fourth switch, a capacitor, a current source, a first resistor, a second resistor, a transduction amplifier, another current source, a current mirror, a skip detection circuit, a switch generation circuit and a control unit. The first switch and the fourth switch are coupled in series and the second switch and the third switch are coupled in series. The first switch is coupled to an input voltage and the second switch is coupled to a ground voltage. One terminal of the capacitor is coupled between the first switch and the fourth switch and another terminal of the capacitor is coupled between the second switch and the third switch. The current source is coupled between the fourth switch and the ground voltage. The first resistor and the second resistor are coupled between the third switch and a reference voltage. The transduction amplifier has a first input terminal, a second input terminal and an output terminal, wherein the first input terminal is coupled between the first resistor and the second resistor and the second input terminal is coupled to the ground voltage, the another current source is coupled to the output terminal of the transduction amplifier. The current mirror is coupled to the current source and the another current source respectively. The skip detection circuit is coupled to the current mirror. The switch generation circuit is coupled to the skip detection circuit. The control unit is coupled to the switch generation circuit, the first switch, the second switch, the third switch and the four switch respectively.

The charge pump circuit operating method includes steps of: (a) starting the charge pump circuit; (b) operating the charge pump circuit in a first phase, wherein the first switch and second switch are conducted and the third switch and fourth switch are disconnected; (c) operating the charge pump circuit in a second phase, wherein the third switch and fourth switch are conducted and the first switch and second switch are disconnected; (d) determining whether a detected voltage in the skip detection circuit is higher than or lower than a threshold voltage twice in succession; and (e) if a determination result of the step (d) is yes, generating a specific counted value and adjusting a switching frequency of the charge pump circuit according to the specific counted value to enhance a conversion efficiency of the charge pump circuit.

Compared to the prior arts, the charge pump circuit and the operation method thereof according to the disclosure automatically reduce the equivalent switching frequency of the charge pump circuit according to the different loads through the skip detection circuit and the switch generation circuit, so that the charge pump circuit of the disclosure can achieve the best conversion efficiency no matter in the condition of light load or heavy load. Therefore, it can effectively improve the poor conversion efficiency of the conventional charge pump circuit in the condition of light load due to the high switching frequency to realize the high efficiency dynamic frequency adjusting charge pump circuit and achieve the effects of adaptive frequency control and optimization of conversion efficiency of the charge pump circuit.

The advantage and spirit of the disclosure may be understood by the following detailed descriptions together with the appended drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A preferred embodiment of the disclosure is a charge pump circuit. In this embodiment, the charge pump circuit can be applied to a source driver of an OLED display panel (e.g., AMOLED display panel) for receiving an input voltage and provides an output voltage to the load, but not limited to this.

Figure 1:
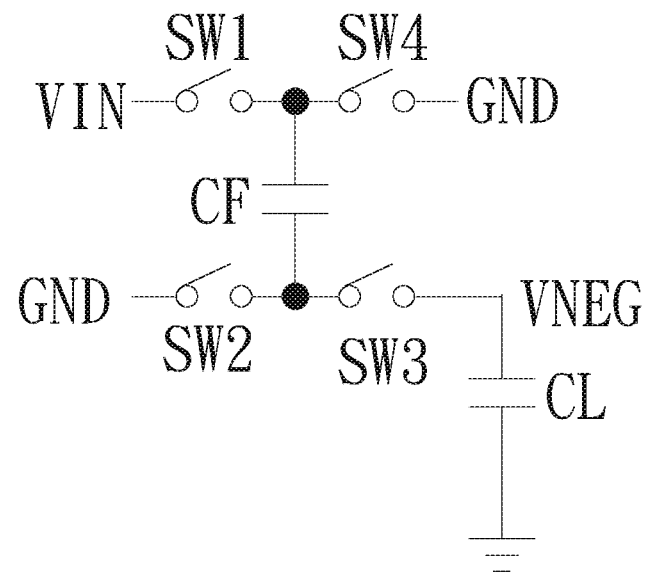
FIG. 1 illustrates a schematic diagram of the conventional charge pump circuit.
Figure 2:
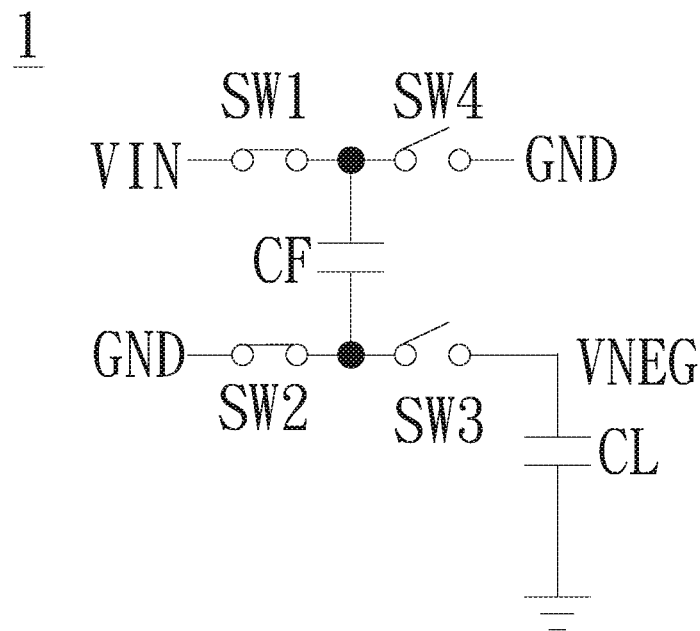
FIG. 2 illustrates a schematic diagram of the conventional charge pump circuit operated in the charging phase.
Figure 3:
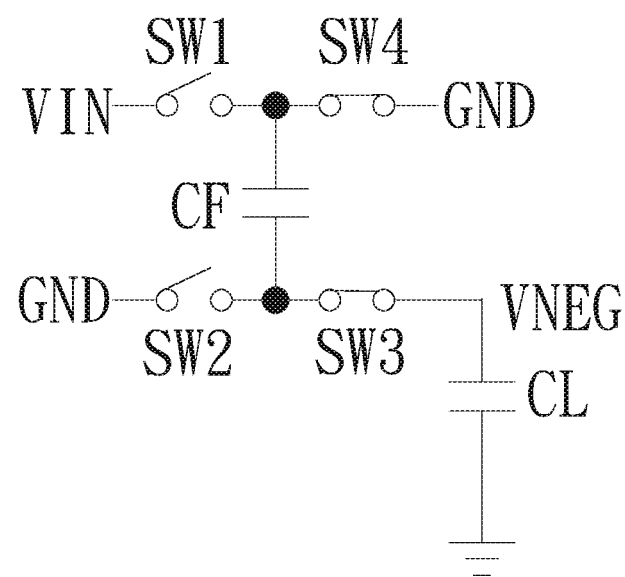
FIG. 3 illustrates a schematic diagram of the conventional charge pump circuit operated in the transfer phase.
Figure 4:
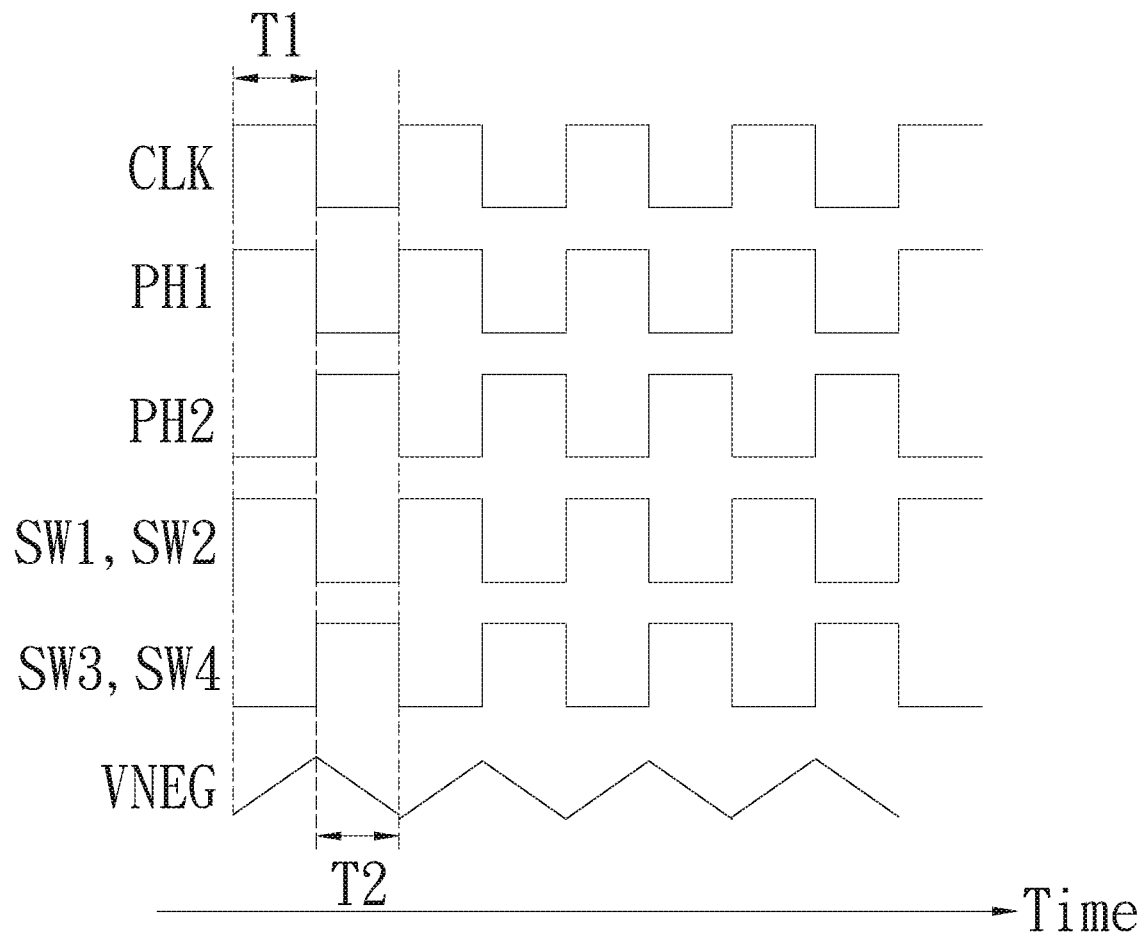
FIG. 4 illustrates timing diagrams of the signals in the conventional charge pump circuit.
Figure 5:
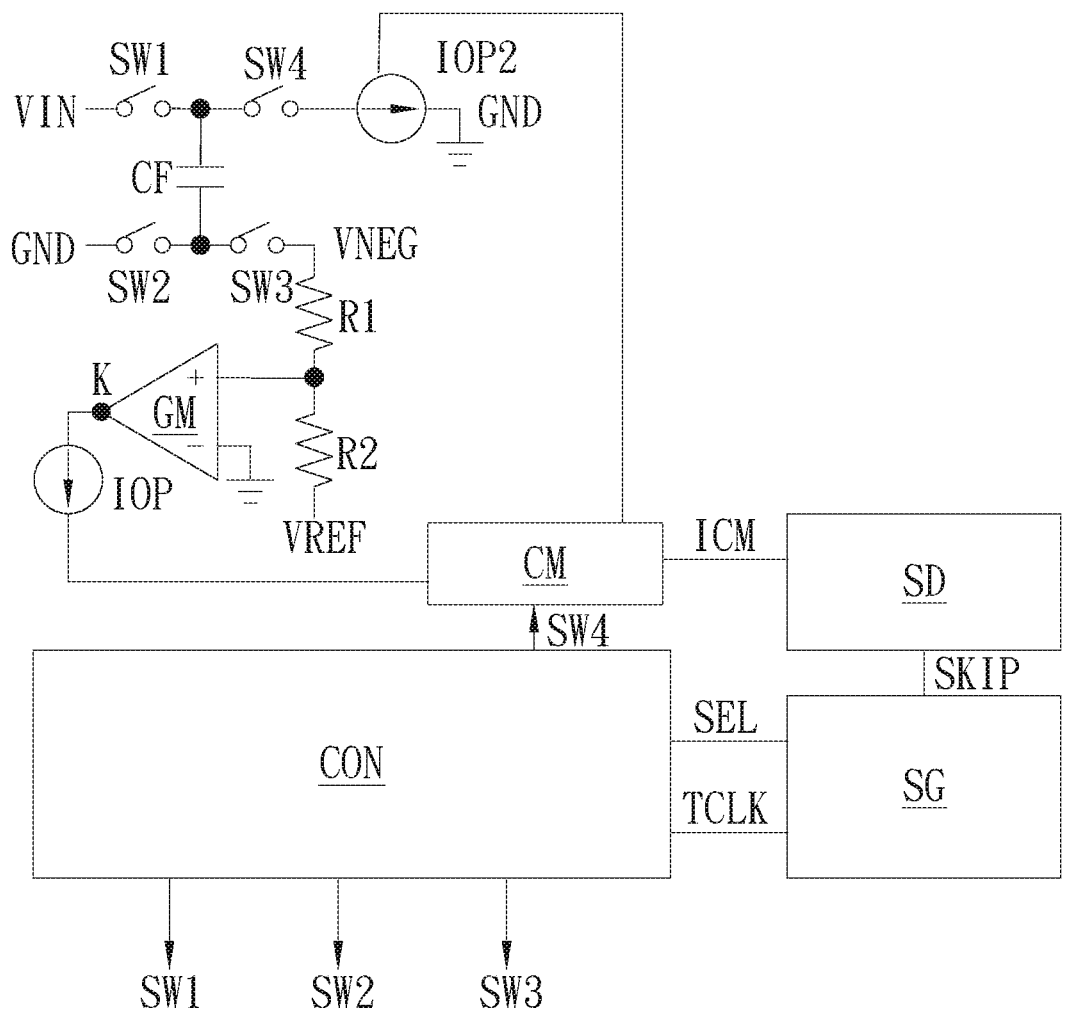
FIG. 5 illustrates a schematic diagram of the charge pump circuit in an embodiment of the disclosure.

Please refer to FIG. 5. FIG. 5 illustrates a schematic diagram of the charge pump circuit in this embodiment. As shown in FIG. 5, the charge pump circuit CHP includes a first switch SW1, a second switch SW2, a third switch SW3, a fourth switch SW4, a capacitor CF, a current source IOP2, a first resistor R1, a second resistor R2, a transduction amplifier GM, another current source IOP, a current mirror CM, a skip detection circuit SD, a switch generation circuit SG and a control unit CON.

The first switch SW1 and the fourth switch SW4 are coupled in series and the second switch SW2 and the third switch SW3 are coupled in series. The first switch SW1 is coupled to an input voltage VIN and the second switch SW2 is coupled to a ground voltage GND. One terminal of the capacitor CF is coupled between the first switch SW1 and the fourth switch SW4 and another terminal of the capacitor CF is coupled between the second switch SW2 and the third switch SW3. The current source IOP2 is coupled between the fourth switch SW4 and the ground voltage GND. The first resistor R1 and the second resistor R2 are coupled between the third switch SW3 and a reference voltage VREF.

The transduction amplifier GM has a first input terminal +, a second input terminal − and an output terminal K, wherein the first input terminal + is coupled between the first resistor R1 and the second resistor R2 and the second input terminal − is coupled to the ground voltage GND. The another current source IOP is coupled to the output terminal K of the transduction amplifier GM. The current mirror CM is coupled to the current source IOP2 and the another current source IOP respectively. The skip detection circuit SD is coupled to the current mirror CM. The switch generation circuit SG is coupled to the skip detection circuit SD. The control unit CON is coupled to the switch generation circuit SG, the first switch SW1, the second switch SW2, the third switch SW3 and the four switch SW4 respectively.

It should be noticed that, in the charge pump circuit CHP of the disclosure, after the current outputted by the output terminal K of the transduction amplifier GM is transferred through the current mirror CM, the switching frequency at light-load can be automatically decreased through the skip detection circuit SD and the switch generation circuit SG to enhance the light-load efficiency of the charge pump circuit CHP.

In practical applications, the charge pump circuit CHP can be selectively operated in the first phase (e.g., the charging phase) or the second phase (e.g., the transfer phase). When the charge pump circuit CHP is operated in the first phase (e.g., the charging phase), the control unit CON will conduct the first switch SW1 and the second switch SW2 and disconnect the third switch SW3 and the fourth switch SW4, so that the capacitor CF can be charged by the input voltage VIN to store charges. When the charge pump circuit CHP is operated in the second phase (e.g., the transfer phase), the control unit CON will conduct the third switch SW3 and the fourth switch SW4 and disconnect the first switch SW1 and the second switch SW2, so that the charges stored in the capacitor CF will flow out to form a transfer current.

The current mirror CM is used to generate a mirror current ICM related to the current source IOP2 and another current source IOP to the skip detection circuit SD. The skip detection circuit SD is used to receive the mirror current ICM and generate a skip detection signal SKIP to the switch generation circuit SG. The switch generation circuit SG is used to receive the skip detection signal SKIP and generate a clock cycle signal TCLK and a phase selection signal SEL. The control unit CON is used to control the operation of the first switch SW1, the second switch SW2, the third switch SW3 and the fourth switch SW4 according to the clock cycle signal TCLK and the phase selection signal SEL.

When the charge pump circuit CHP is operated in the first phase (e.g., the charging phase), the control unit CON will conduct the first switch SW1 and the second switch SW2 and disconnect the third switch SW3 and the fourth switch SW4 according to the clock cycle signal TCLK and the phase selection signal SEL, so that the capacitor CF can be charged by the input voltage VIN to store charges. When the charge pump circuit CHP is operated in the second phase (e.g., the transfer phase), the control unit CON will conduct the third switch SW3 and the fourth switch SW4 and disconnect the first switch SW1 and the second switch SW2 according to the clock cycle signal TCLK and the phase selection signal SEL, so that the charges stored in the capacitor CF will flow out to form the transfer current.

Figure 6:
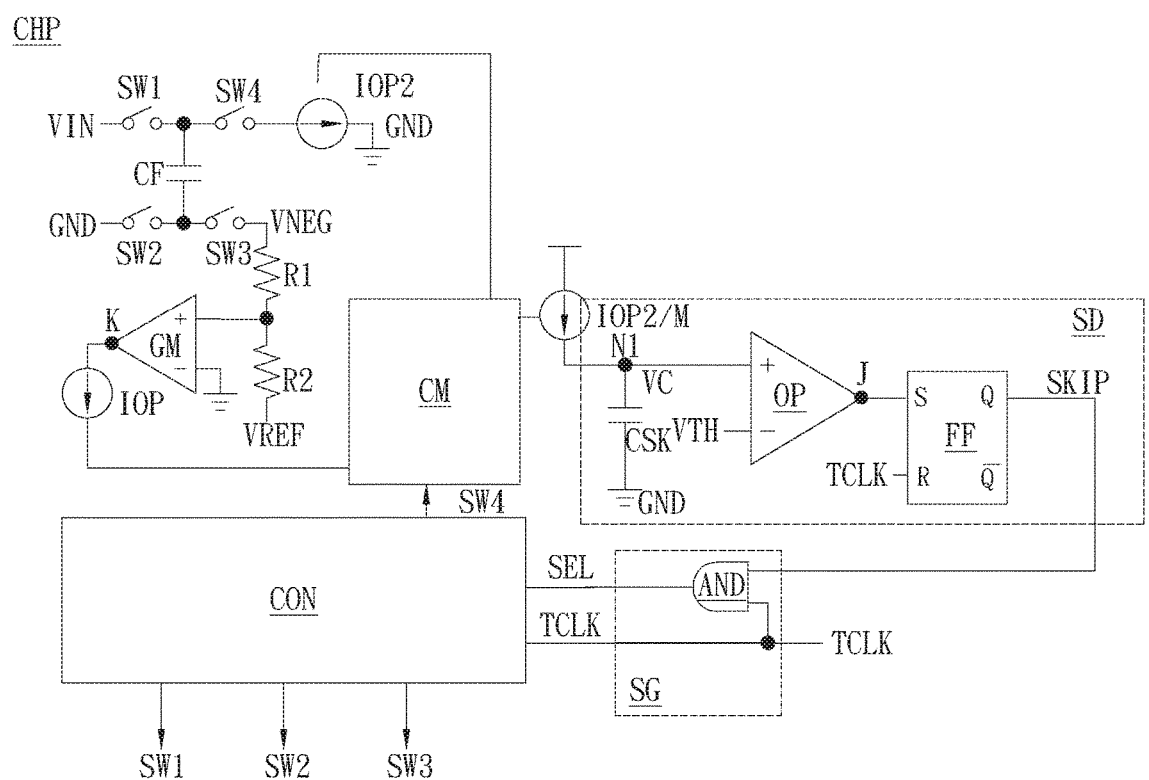
FIG. 6 illustrates a schematic diagram of the charge pump circuit in another embodiment of the disclosure.

Then, please refer to FIG. 6, in another embodiment, the skip detection circuit SD can include a capacitor CSK, an operational amplifier OP and a flip-flop FF. The first input terminal + and the second input terminal − of the operational amplifier OP are coupled to the mirror current IOP2/M (wherein M is a magnification) and a threshold voltage VTH respectively and the output terminal J of the operational amplifier OP is coupled to the input terminal S of the flip-flop FF. The capacitor CSK is coupled between a first node N1 at the first input terminal + of the operational amplifier OP and the ground terminal GND, and the first node N1 has a detected voltage VC.

The operational amplifier OP compares the detected voltage VC with the threshold voltage VTH and outputs the comparing result to the input terminal S of the flip-flop FF. Another input terminal R of the flip-flop FF is coupled to the clock cycle signal TCLK. The output terminal Q of the flip-flop FF outputs the skip detection signal SKIP to the switch generation circuit SG. The switch generation circuit SG can include an AND gate AND. The AND gate AND receives the skip detection signal SKIP and the clock cycle signal TCLK respectively and outputs the phase selection signal SEL to the control unit CON. In addition, the switch generation circuit SG also output the clock cycle signal TCLK to the control unit CON at the same time. Then, the control unit CON controls the operation of the first switch SW1, the second switch SW2, the third switch SW3 and the fourth switch SW4 according to the clock cycle signal TCLK and the phase selection signal SEL, so that the charge pump circuit CHP can be switched between the first phase (e.g., the charging phase) and the second phase (e.g., the transfer phase).

Figure 7A:
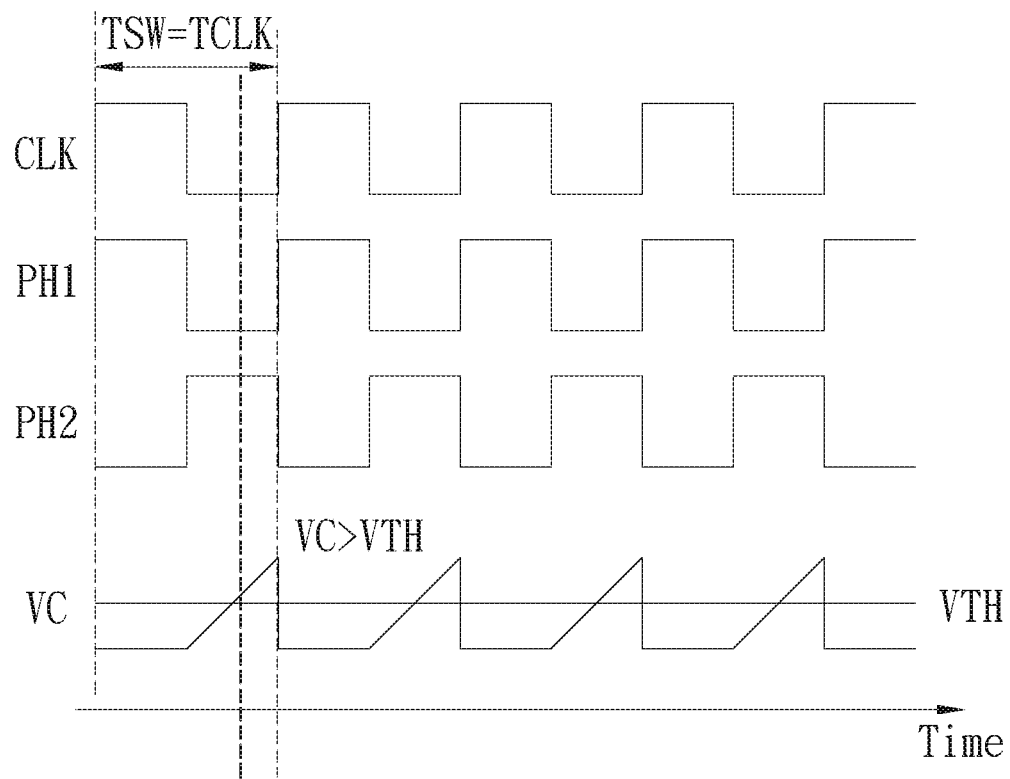
FIG. 7A and FIG. 7B illustrates timing diagrams of the charge pump circuit maintaining the switching frequency in the condition of heavy-load and decreasing the switching frequency in the condition of light-load in the disclosure respectively.
Figure 7B:
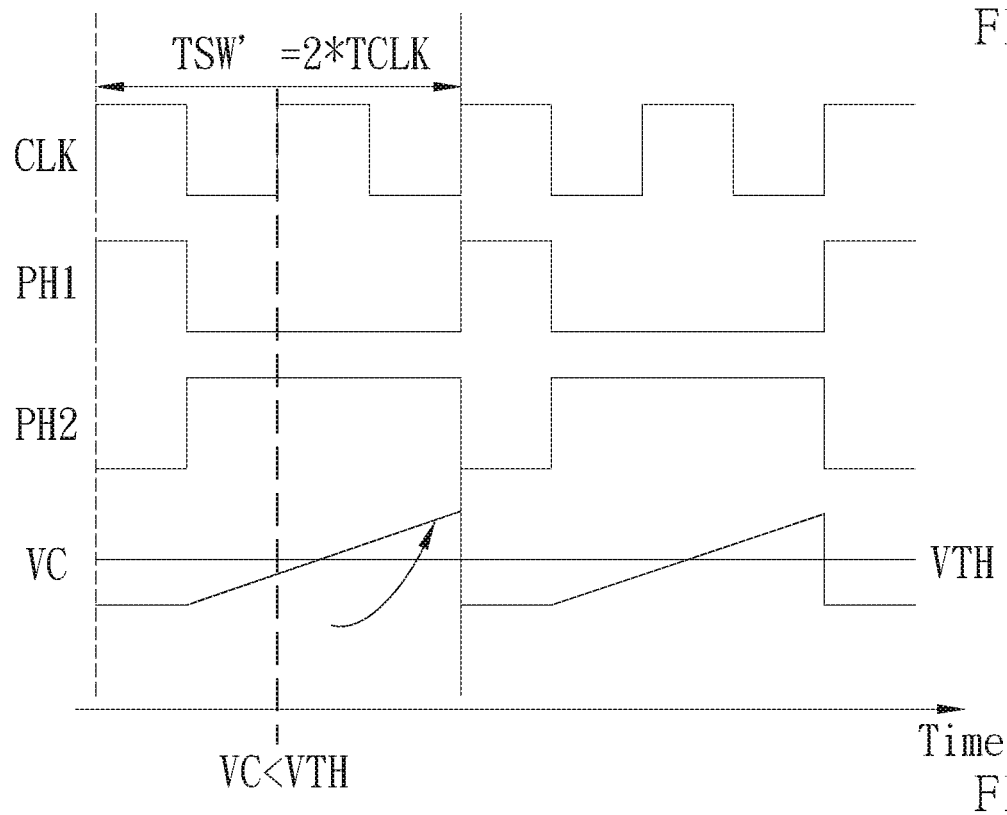

Then, please refer to FIG. 7A and FIG. 7B. FIG. 7A and FIG. 7B illustrates timing diagrams of the charge pump circuit CHP maintaining the switching frequency in the condition of heavy-load and decreasing the switching frequency in the condition of light-load in the disclosure respectively.

As shown in FIG. 7A, when the charge pump circuit CHP is operated at heavy-load, the phase of the first phase signal PH1 is the same with the phase of the clock signal CLK and the phase of the second phase signal PH2 is inverted to the phase of the clock signal CLK, and the switching frequency TSW of the charge pump circuit CHP equals to the clock cycle signal TCLK; that is to say, the switching frequency of the charge pump circuit CHP will be maintained unchanged.

Please also refer to FIG. 6. It is assumed that the mirror current is IOP2/M (wherein M is a scaling factor) used for charging the capacitor CSK, then the detected voltage VC at the first node N1 will be positively correlated with the output load. When the load becomes heavier, the output terminal K of the transduction amplifier GM will output larger current to form higher detected voltage VC at the first node N1. During the cycle that the fourth switch SW4 is conducted, the detected voltage VC is higher than the threshold voltage VTH; since the load is heavy enough, the charge pump circuit CHP can repeat the Ping-pong way, namely in the switching order of the first phase (e.g., the charging phase)->the second phase (e.g., the transfer phase)->the first phase (e.g., the charging phase)->the second phase (e.g., the transfer phase) to achieve the best charge transfer effect.

When the first phase signal PH1 is at high-level and the second phase signal PH2 is at low-level, the charge pump circuit CHP is operated in the first phase (the charging phase); at this time, the first switch SW1 and the second switch SW2 are conducted and the third switch SW3 and the fourth switch SW4 are disconnected, the detected voltage VC at the first node N1 is 0. When the first phase signal PH1 is at low-level and the second phase signal PH2 is at high-level, the charge pump circuit CHP is operated in the second phase (the transfer phase); at this time, the first switch SW1 and the second switch SW2 are disconnected and the third switch SW3 and the fourth switch SW4 are conducted, the detected voltage VC at the first node N1 is linearly increased from 0 until the switching cycle TSW is finished.

As shown in FIG. 7B, when the charge pump circuit CHP is operated in the condition of light-load, even the phase of the first phase signal PH1 is the same with the phase of the clock signal CLK and the phase of the second phase signal PH2 is inverted to the phase of the clock signal CLK; however, during the cycle that the fourth switch SW4 is conducted, the detected voltage VC is lower than the threshold voltage VTH, the first phase signal PH1 and the second phase signal PH2 will skip a part of pulses to extend the time that the charge pump circuit CHP is operated in the second phase (the transfer phase), and the charge pump circuit CHP will be not switched to the first phase (the charging phase) until the detected voltage VC becomes higher than the threshold voltage VTH. That is to say, the charge pump circuit CHP can be operated in the switching order of the first phase (e.g., the charging phase)->the second phase (e.g., the transfer phase)-> the second phase (e.g., the transfer phase)->the second phase (e.g., the transfer phase)->the first phase (e.g., the charging phase) to achieve the best charge transfer effect. By doing so, the switching cycle TSW of the charge pump circuit CHP is increased to twice the clock cycle signal TCLK (but not limited to this), namely the switching frequency of the charge pump circuit CHP is decreased.

When the charge pump circuit CHP is operated in the second phase (the transfer phase), the first switch SW1 and the second switch SW2 are disconnected and the third switch SW3 and the fourth switch SW4 are conducted, the detected voltage VC at the first node N1 is linearly increased from 0 until the switching cycle TSW is finished. Since the switching cycle TSW of the charge pump circuit CHP in the condition of light-load is increased to twice the switching cycle TSW of the charge pump circuit CHP in the condition of heavy-load, the slop of the linearly increased detected voltage VC in the condition of light-load will be obviously smaller than the slop of the linearly increased detected voltage VC in the condition of heavy-load to avoid the poor transfer efficiency of the charge pump circuit CHP in the condition of light-load.

Figure 8A:
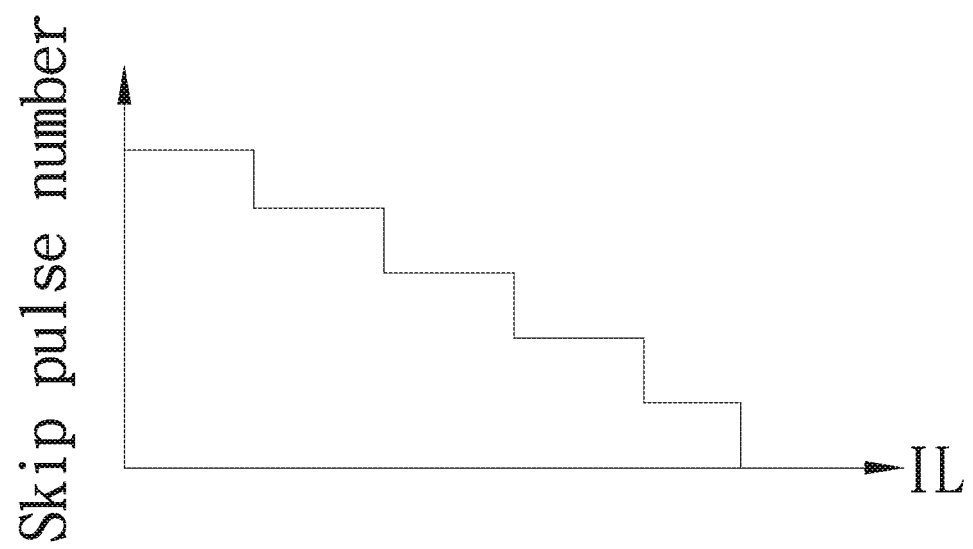
FIG. 8A illustrates a schematic diagram of the corresponding relationship between the number of skipped pulses and the load current.
Figure 8B:
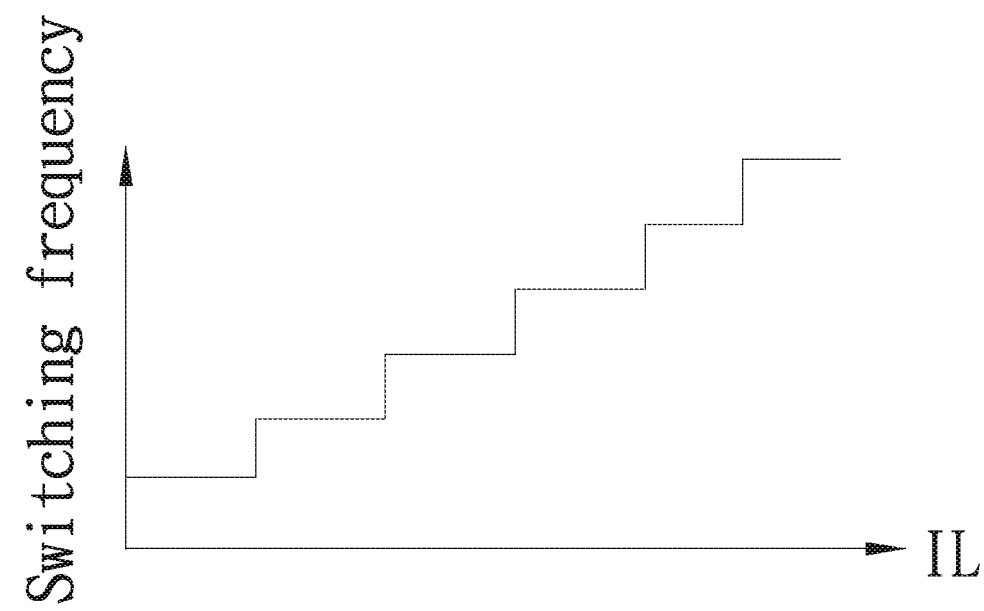
FIG. 8B illustrates a schematic diagram of the corresponding relationship between the switching frequency and the load current.

Then, please refer to FIG. 8A and FIG. 8B. FIG. 8A illustrates a schematic diagram of the corresponding relationship between the number of skipped pulses and the load current; FIG. 8B illustrates a schematic diagram of the corresponding relationship between the switching frequency and the load current.

As shown in FIG. 8A and FIG. 8B, when the load current IL becomes smaller, namely the load becomes lighter, the first phase signal PH1 and the second phase signal PH2 need to skip more pulses to extend the time that the charge pump circuit CHP is operated in the second phase (the transfer phase) to increase the switching cycle TSW of the charge pump circuit CHP and decrease the switching frequency of the charge pump circuit CHP, so that the transfer efficiency of the charge pump circuit CHP in the condition of light-load can be largely enhanced.

Figure 9:
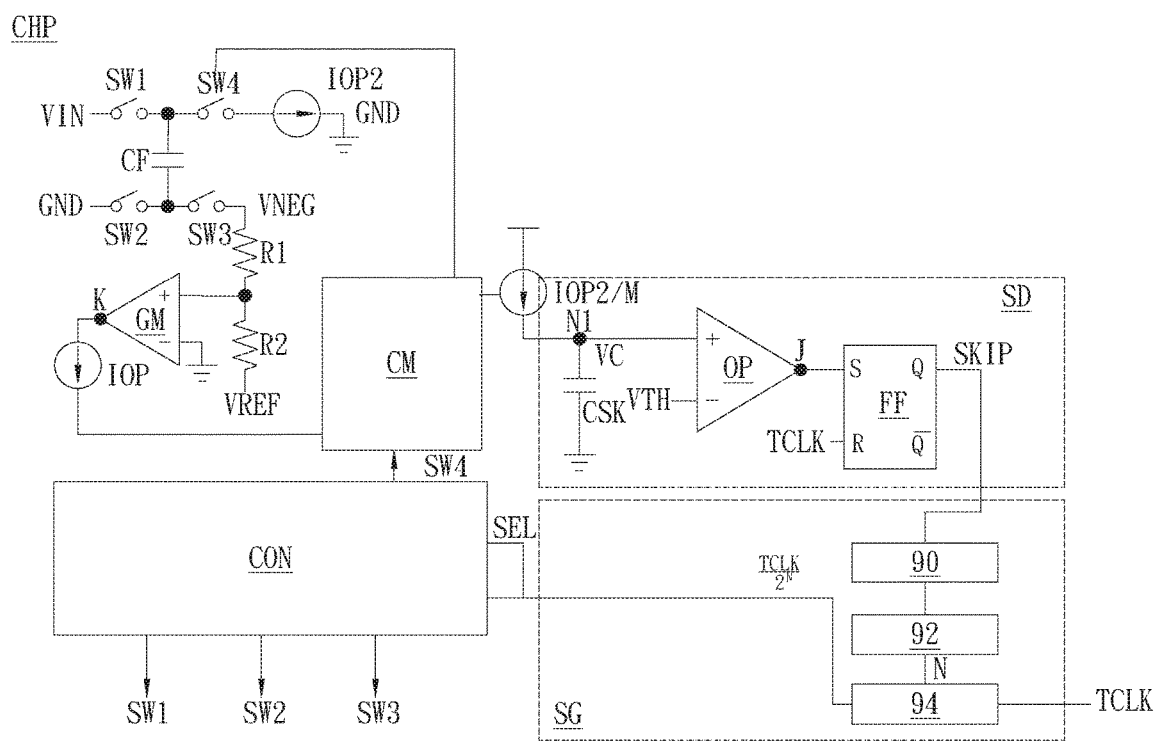
FIG. 9 illustrates a schematic diagram of the charge pump circuit in another embodiment of the disclosure.

Please refer to FIG. 9. In another embodiment, the switching generation circuit SG can include a filtering unit 90, a counting unit 92 and an adjusting unit 94. The filtering unit 90 is used to perform digital filtering on the skip detection signal SKIP. The counting unit 92 generates the specific counted value N to the adjusting unit 94 according to the skip detection signal SKIP, and then the adjusting unit 94 receives the specific counted value N and the clock cycle signal TCLK and adjusts the clock cycle signal TCLK according to the specific counted value N.

For example, the adjusting unit 94 can adjust the clock cycle signal TCLK into TCLK/$2^N$ and then output the phase selection signal SEL and the adjusted clock cycle signal TCLK/$2^N$, but not limited to this.

Another embodiment of the disclosure is a charge pump circuit operating method. In this embodiment, the charge pump circuit operating method is used for operating a charge pump circuit. The charge pump circuit includes a first switch, a second switch, a third switch, a fourth switch, a capacitor, a current source, a first resistor, a second resistor, a transduction amplifier, another current source, a current mirror, a skip detection circuit, a switch generation circuit and a control unit. The first switch and the fourth switch are coupled in series and the second switch and the third switch are coupled in series. The first switch is coupled to an input voltage and the second switch is coupled to a ground voltage. One terminal of the capacitor is coupled between the first switch and the fourth switch and another terminal of the capacitor is coupled between the second switch and the third switch. The current source is coupled between the fourth switch and the ground voltage. The first resistor and the second resistor are coupled between the third switch and a reference voltage. The transduction amplifier has a first input terminal, a second input terminal and an output terminal, wherein the first input terminal is coupled between the first resistor and the second resistor and the second input terminal is coupled to the ground voltage, the another current source is coupled to the output terminal of the transduction amplifier. The current mirror is coupled to the current source and the another current source respectively. The skip detection circuit is coupled to the current mirror. The switch generation circuit is coupled to the skip detection circuit. The control unit is coupled to the switch generation circuit, the first switch, the second switch, the third switch and the four switch respectively.

Figure 10:
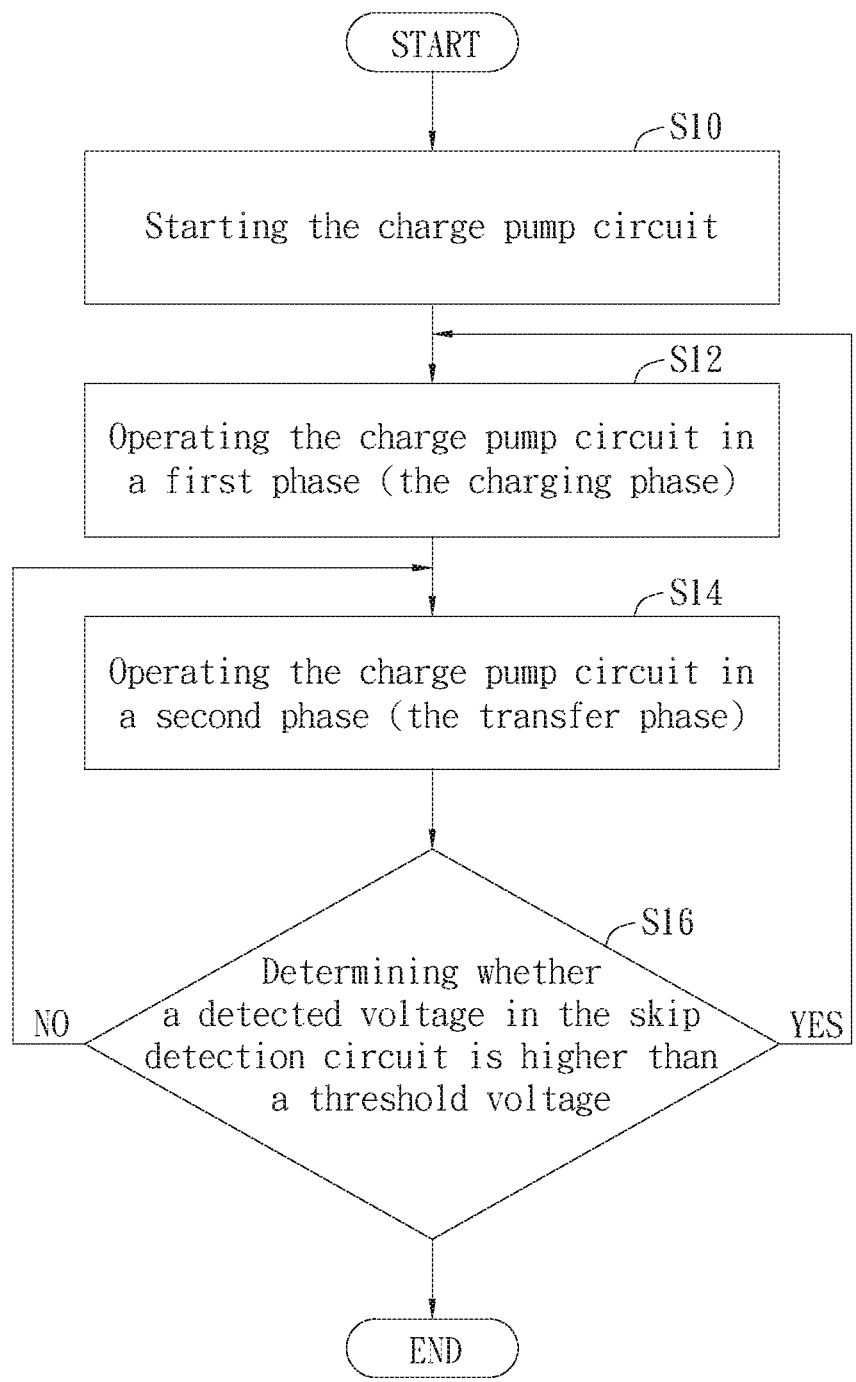
FIG. 10 illustrates a flowchart of the charge pump circuit operating method in another embodiment of the disclosure.

Please refer to FIG. 10. FIG. 10 illustrates a flowchart of the charge pump circuit operating method in this embodiment. As shown in FIG. 10, the charge pump circuit operating method can include steps of:

step S10: starting the charge pump circuit;

step S12: operating the charge pump circuit in a first phase (e.g., the charging phase), wherein the first switch and second switch are conducted and the third switch and fourth switch are disconnected;

step S14: operating the charge pump circuit in a second phase (e.g., the transfer phase), wherein the third switch and fourth switch are conducted and the first switch and second switch are disconnected;

step S16: determining whether a detected voltage in the skip detection circuit is higher than a threshold voltage, wherein the detected voltage in the skip detection circuit is related to the current source and the another current source;

if the determination result of the step S16 is yes, then the step S12 will be performed again; and if the determination result of the step S16 is no, then the step S14 will be performed again.

Another embodiment of the disclosure is a charge pump circuit operating method. In this embodiment, the charge pump circuit operating method is used for operating a charge pump circuit. The charge pump circuit includes a first switch, a second switch, a third switch, a fourth switch, a capacitor, a current source, a first resistor, a second resistor, a transduction amplifier, another current source, a current mirror, a skip detection circuit, a switch generation circuit and a control unit. The first switch and the fourth switch are coupled in series and the second switch and the third switch are coupled in series. The first switch is coupled to an input voltage and the second switch is coupled to a ground voltage. One terminal of the capacitor is coupled between the first switch and the fourth switch and another terminal of the capacitor is coupled between the second switch and the third switch. The current source is coupled between the fourth switch and the ground voltage. The first resistor and the second resistor are coupled between the third switch and a reference voltage. The transduction amplifier has a first input terminal, a second input terminal and an output terminal, wherein the first input terminal is coupled between the first resistor and the second resistor and the second input terminal is coupled to the ground voltage, the another current source is coupled to the output terminal of the transduction amplifier. The current mirror is coupled to the current source and the another current source respectively. The skip detection circuit is coupled to the current mirror. The switch generation circuit is coupled to the skip detection circuit. The control unit is coupled to the switch generation circuit, the first switch, the second switch, the third switch and the four switch respectively.

Figure 11:
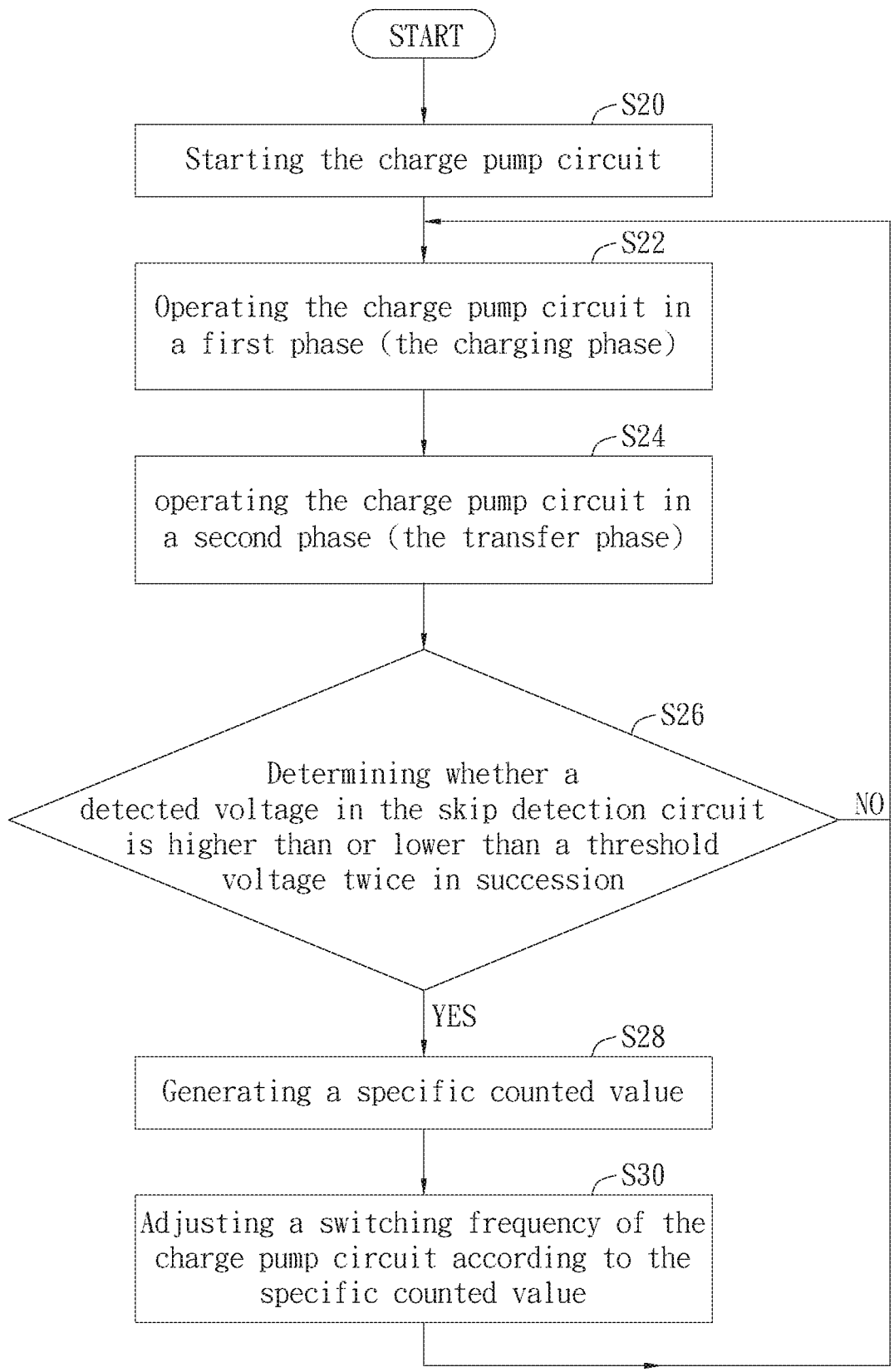
FIG. 11 illustrates a flowchart of the charge pump circuit operating method in another embodiment of the disclosure.

Please refer to FIG. 11. FIG. 11 illustrates a flowchart of the charge pump circuit operating method in this embodiment. As shown in FIG. 11, the charge pump circuit operating method can include steps of:

step S20: starting the charge pump circuit;

step S22: operating the charge pump circuit in a first phase (e.g., the charging phase), wherein the first switch and second switch are conducted and the third switch and fourth switch are disconnected;

step S24: operating the charge pump circuit in a second phase (e.g., the transfer phase), wherein the third switch and fourth switch are conducted and the first switch and second switch are disconnected;

step S26: determining whether a detected voltage in the skip detection circuit is higher than or lower than a threshold voltage twice in succession, wherein the detected voltage in the skip detection circuit is related to the current source and the another current source; and step S28: if the determination result of the step S26 is yes, generating a specific counted value;

step S30: adjusting a switching frequency of the charge pump circuit according to the specific counted value to enhance a conversion efficiency of the charge pump circuit; and if the determination result of the step S26 is no or when the step S30 is finished, the step S22 will be performed again.

Compared to the prior arts, the charge pump circuit and the operation method thereof according to the disclosure automatically reduce the equivalent switching frequency of the charge pump circuit according to the different loads through the skip detection circuit and the switch generation circuit, so that the charge pump circuit of the disclosure can achieve the best conversion efficiency no matter in the condition of light load or heavy load. Therefore, it can effectively improve the poor conversion efficiency of the conventional charge pump circuit in the condition of light load due to the high switching frequency to realize the high efficiency dynamic frequency adjusting charge pump circuit and achieve the effects of adaptive frequency control and optimization of conversion efficiency of the charge pump circuit.

With the example and explanations above, the features and spirits of the disclosure will be hopefully well described. Those skilled in the art will readily observe that numerous modifications and alterations of the device may be made while retaining the teaching of the disclosure. Accordingly, the above disclosure should be construed as limited only by the metes and bounds of the appended claims.

What is claimed is:

1. A charge pump circuit, comprising:
 a first switch, a second switch, a third switch and a fourth switch, wherein the first switch and the fourth switch are coupled in series and the second switch and the third switch are coupled in series, the first switch is coupled to an input voltage and the second switch is coupled to a ground voltage;

a capacitor, one terminal of the capacitor being coupled between the first switch and the fourth switch and another terminal of the capacitor being coupled between the second switch and the third switch;

a current source, coupled between the fourth switch and the ground voltage;

a first resistor and a second resistor, coupled in series between the third switch and a reference voltage;

a transduction amplifier having a first input terminal, a second input terminal and an output terminal, wherein the first input terminal is coupled between the first resistor and the second resistor and the second input terminal is coupled to the ground voltage;

another current source, coupled to the output terminal of the transduction amplifier;

a current mirror, coupled to the current source and the another current source respectively, for generating a mirror current related to the and current source and the another current source;

a skip detection circuit, coupled to the current mirror, for receiving the mirror current and generating a skip detection signal;

a switch generation circuit, coupled to the skip detection circuit, for receiving the skip detection signal and generating a clock cycle signal and a phase selection signal; and a control unit, coupled to the switch generation circuit, the first switch, the second switch, the third switch and the fourth switch respectively, for controlling the operation of the first switch, the second switch, the third switch and the fourth switch according to the clock cycle signal and the phase selection signal.

2. The charge pump circuit of claim 1, wherein a detection voltage of the skip detection circuit is related to the current source and the another current source; the skip detection circuit generates the skip detection signal according to a comparing result of the detection voltage and a threshold voltage.

3. The charge pump circuit of claim 1, wherein when the charge pump circuit is operated in a first phase, the control unit conducts the first switch and the second switch and disconnects the third switch and the fourth switch.

4. The charge pump circuit of claim 1, wherein the switch generation circuit comprises a counting unit and an adjusting unit; the counting unit generates a specific counted value to the adjusting unit according to the skip detection signal, and the adjusting unit receives the specific counted value and a clock cycle signal and outputs the clock cycle signal and the phase selection signal.

5. The charge pump circuit of claim 3, wherein the first phase is a charging phase and the second phase is a transfer phase.

6. A charge pump circuit operating method, for operating a charge pump circuit, the charge pump circuit comprising a first switch, a second switch, a third switch, a fourth switch, a capacitor, a current source, a first resistor, a second resistor, a transduction amplifier, another current source, a current mirror, a skip detection circuit, a switch generation circuit and a control unit, the first switch and the fourth switch being coupled in series and the second switch and the third switch being coupled in series, the first switch being coupled to an input voltage and the second switch being coupled to a ground voltage, one terminal of the capacitor being coupled between the first switch and the fourth switch and another terminal of the capacitor being coupled between the second switch and the third switch, the current source being coupled between the fourth switch and the ground voltage, the first resistor and the second resistor being coupled between the third switch and a reference voltage, the transduction amplifier having a first input terminal, a second input terminal and an output terminal, wherein the first input terminal is coupled between the first resistor and the second resistor and the second input terminal is coupled to the ground voltage, the another current source is coupled to the output terminal of the transduction amplifier, the current mirror is coupled to the current source and the another current source respectively, the skip detection circuit is coupled to the current mirror, the switch generation circuit is coupled to the skip detection circuit, the control unit is coupled to the switch generation circuit, the first switch, the second switch, the third switch and the four switch respectively, the charge pump circuit operating method comprises steps of:

(a) starting the charge pump circuit;

(b) operating the charge pump circuit in a first phase, wherein the first switch and second switch are conducted and the third switch and fourth switch are disconnected;

(c) operating the charge pump circuit in a second phase, wherein the third switch and fourth switch are conducted and the first switch and second switch are disconnected;

(d) determining whether a detected voltage in the skip detection circuit is higher than a threshold voltage; and (e) selectively performing the step (b) or the step (c) again according to a determination result of the step (d).

7. The charge pump circuit operating method of claim 6, wherein the first phase is a charging phase and the second phase is a transfer phase.

8. The charge pump circuit operating method of claim 6, wherein the detection voltage of the skip detection circuit is related to the current source and the another current source.

9. The charge pump circuit operating method of claim 6, wherein in the step (e), if a determination result of the step (d) is yes, then the step (b) is performed again; if a determination result of the step (d) is no, then the step (c) is performed again.

10. A charge pump circuit operating method, for operating a charge pump circuit, the charge pump circuit comprising a first switch, a second switch, a third switch, a fourth switch, a capacitor, a current source, a first resistor, a second resistor, a transduction amplifier, another current source, a current mirror, a skip detection circuit, a switch generation circuit and a control unit, the first switch and the fourth switch being coupled in series and the second switch and the third switch being coupled in series, the first switch being coupled to an input voltage and the second switch being coupled to a ground voltage, one terminal of the capacitor being coupled between the first switch and the fourth switch and another terminal of the capacitor being coupled between the second switch and the third switch, the current source being coupled between the fourth switch and the ground voltage, the first resistor and the second resistor being coupled between the third switch and a reference voltage, the transduction amplifier having a first input terminal, a second input terminal and an output terminal, wherein the first input terminal is coupled between the first resistor and the second resistor and the second input terminal is coupled to the ground voltage, the another current source is coupled to the output terminal of the transduction amplifier, the current mirror is coupled to the current source and the another current source respectively, the skip detection circuit is coupled to the current mirror, the switch generation circuit is coupled to the skip detection circuit, the control unit is coupled to the switch generation circuit, the first switch, the second switch, the third switch and the four switch respectively, the charge pump circuit operating method comprises steps of:
- (a) starting the charge pump circuit;
- (b) operating the charge pump circuit in a first phase, wherein the first switch and second switch are conducted and the third switch and fourth switch are disconnected;
- (c) operating the charge pump circuit in a second phase, wherein the third switch and fourth switch are conducted and the first switch and second switch are disconnected;
- (d) determining whether a detected voltage in the skip detection circuit is higher than or lower than a threshold voltage twice in succession; and
- (e) if a determination result of the step (d) is yes, generating a specific counted value and adjusting a switching frequency of the charge pump circuit according to the specific counted value to enhance a conversion efficiency of the charge pump circuit.

11. The charge pump circuit operating method of claim 10, wherein the first phase is a charging phase and the second phase is a transfer phase.

12. The charge pump circuit operating method of claim 10, wherein the detection voltage of the skip detection circuit is related to the current source and the another current source.

13. The charge pump circuit operating method of claim 10, wherein in the step (e), if the determination result of the step (d) is no, then the step (b) is performed again.

14. The charge pump circuit operating method of claim 10, wherein when the step (e) is finished, then the step (b) is performed again.

* * * * *